United States Patent
Lu

(10) Patent No.: US 8,484,513 B2
(45) Date of Patent: Jul. 9, 2013

(54) SIGNAL TEST APPARATUS AND METHOD

(75) Inventor: Huang-Ching Lu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 309 days.

(21) Appl. No.: 12/854,910

(22) Filed: Aug. 12, 2010

(65) Prior Publication Data

US 2011/0264955 A1     Oct. 27, 2011

(30) Foreign Application Priority Data

Apr. 21, 2010  (TW) .............................. 99112543 A

(51) Int. Cl.
    *G06F 11/00*     (2006.01)
(52) U.S. Cl.
    USPC .................... 714/19; 714/15; 714/20

(58) Field of Classification Search
    USPC ................................... 714/16, 19, 20
    See application file for complete search history.

(56) References Cited

U.S. PATENT DOCUMENTS

| | | | |
|---|---|---|---|
| 2005/0166093 A1* | 7/2005 | Hakuchoh et al. | 714/31 |
| 2009/0313503 A1* | 12/2009 | Atluri et al. | 714/19 |
| 2011/0145643 A1* | 6/2011 | Kumar et al. | 714/33 |
| 2011/0239070 A1* | 9/2011 | Morrison | 714/731 |

* cited by examiner

*Primary Examiner* — Sarai Butler
(74) *Attorney, Agent, or Firm* — Altis Law Group, Inc.

(57) ABSTRACT

A system and method for restoring a signal test apparatus to a previous state receives a time interval set by a user to create restore point files. The signal test apparatus tests signals of a test object and creates a restore point file according to the time interval. The restore point file stores signal test data of a test object when the restore point file is created. If the signal test apparatus needs to be restored to a previous state, the signal test data of a latest restore point file are acquired. The acquired signal test data are displayed on a display of the signal test apparatus.

9 Claims, 4 Drawing Sheets

SIGNAL TEST APPARATUS AND METHOD

BACKGROUND

1. Technical Field

Embodiments of the present disclosure relate to test methods, and more particularly, to a signal test apparatus and method.

2. Description of Related Art

A signal test apparatus can test signals from an object and provide waveform charts of tested signals for a user to check. If the signal test apparatus is switched to test another signal, for example, testing a read signal then switching to test a write signal, the signal test apparatus may display a plurality of test data items. However, it may be difficult for a user to recognize which data was on a time of switching and which data was collected after from among all the test data items. If the signal test apparatus tests the signals wrongly because of error operation of the user, the user have to operate the signal test apparatus to test the signals one more time.

DETAILED DESCRIPTION

The disclosure is illustrated by way of examples and not by way of limitation in the fingers of the accompanying drawings in which like references indicate similar elements. It should be noted that references to "an" or "one" embodiment in this disclosure are not necessarily to the same embodiment, and such references mean at least one.

In general, the word "module," as used hereinafter, refers to logic embodied in hardware or firmware, or to a collection of software instructions, written in a programming language, such as, for example, Java, C, or assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
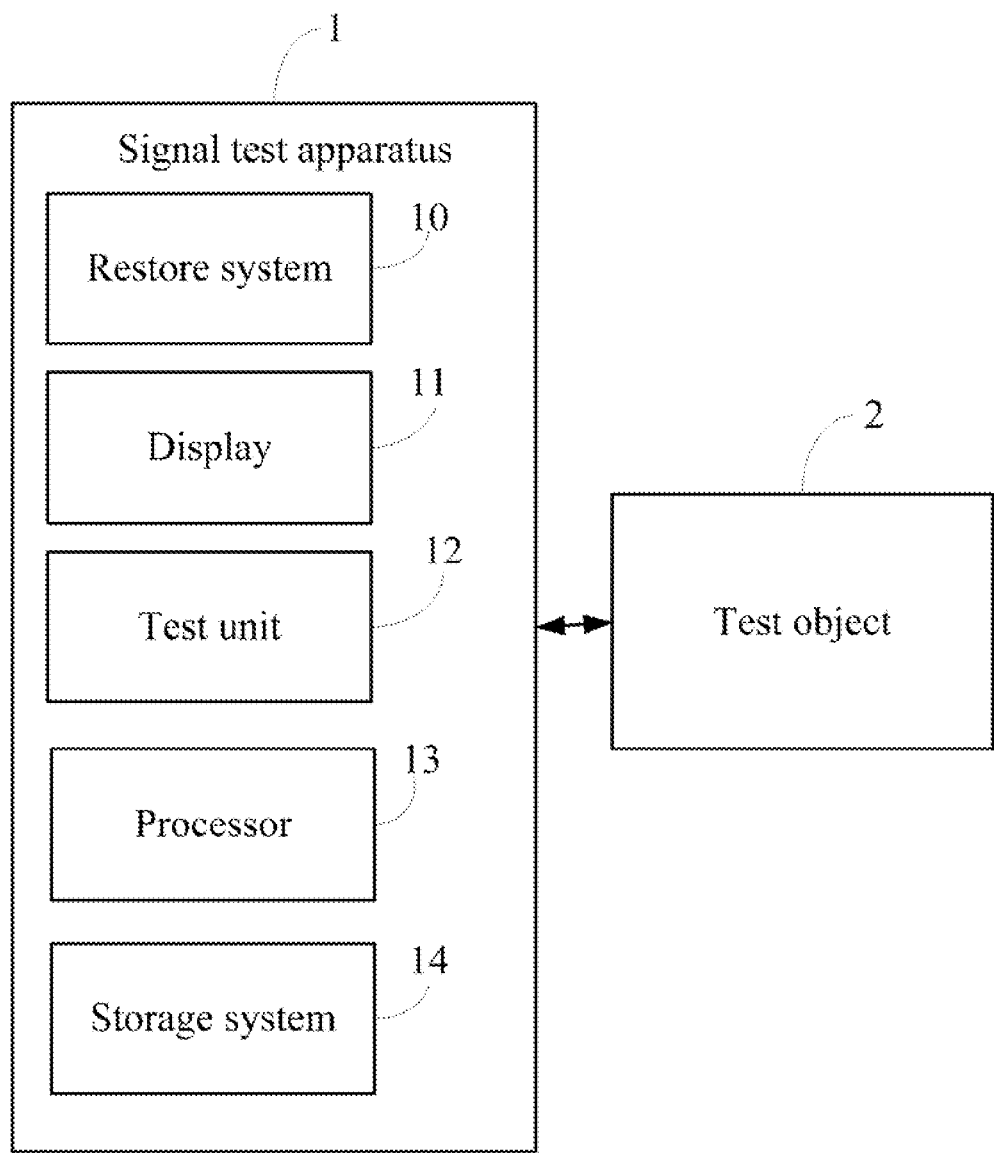
FIG. 1 is a block diagram of one embodiment of a signal test apparatus 1 comprising a restore system.

FIG. 1 is a block diagram of one embodiment of a signal test apparatus 1. In one embodiment, the signal test apparatus 1 includes a restore system 10, a display 11, a test unit 12, a processor 13, and a storage system 14. A test object 2 is electronically connected to the signal test apparatus 1. The test unit 12 tests the test object 2 to acquire signal test data. Depending on the embodiment, the signal test apparatus 1 may be an oscillograph or a signal spectrum analyzer. The test object 2 may be a memory of a computer. The test unit 12 may be used to test read and write signals of the memory of the computer, and acquire signal test data from the test.

The restore system 10 may be used to restore the signal test apparatus 1 to a previous state. In one embodiment, if operator error causes the test unit 12 to test a signal wrongly, the restore system 10 may restore the signal test apparatus 1 back to a condition that existed before the error occurred. For example, the signal test apparatus stores signal test data every a predetermined time when the test unit tests the signal. If power supply of the signal test apparatus 1 is cut off, the test unit 12 may test the signal wrongly. If the power supply is recovered, the restore system 10 reads the stored signal test data that was tested before the power supply is cut off and displays the signal test data on the display 11. One or more computerized codes of the restore system 10 are stored in the storage system 14, where the processor 13 executes the one or computerized codes, to provide one or more aforementioned operations of the restore system 10. The storage system 104 stores one or more programs, such as those of an operating system, other applications, and various data. In some embodiment, the storage system 14 also stores the signal test data of the test object 2. The display 11 displays a waveform chart of test signals of the test object 2.

Figure 2:
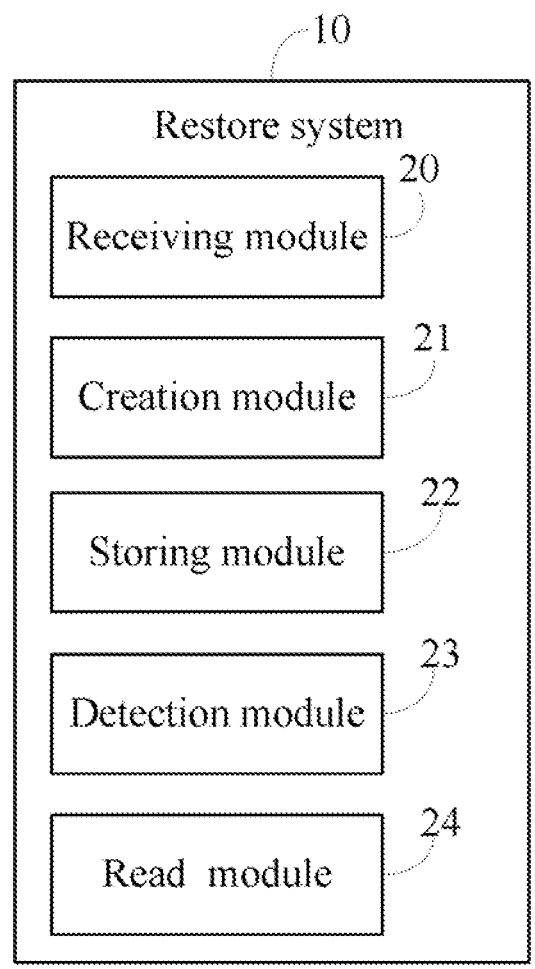
FIG. 2 is a block diagram of one embodiment of function modules of the restore system in FIG. 1.

As shown in FIG. 2, the restore system 10 may include a receiving module 20, a creation module 21, a storing module 22, a detection module 23, and a read module 24.

The receiving module 20 receives a time interval that is used to create restore point files of restore points of the signal test apparatus 1 and a storage path for storing the restore point files set by a user. The time when each restore point file is created is defined as a restore point. The time interval is a time between each two restore points. The restore point is created if the signal test apparatus 1 needs to be restored. The restore point file is a file, such as a txt file or a EXCEL file. The restore point file is used for storing signal test data of each restore point acquired by the test unit 12. In one embodiment, the signal test data may include a current system time of the signal test apparatus 1, test channels of the signal test apparatus 1, waveform charts of the signal test data corresponding to the current system time.

The creation module 21 creates restore point files in the storage path according to the time interval. The restore point file may be named by time stamping the restore point file with the current system time of the signal test apparatus when the restore point file is created.

Figure 4:
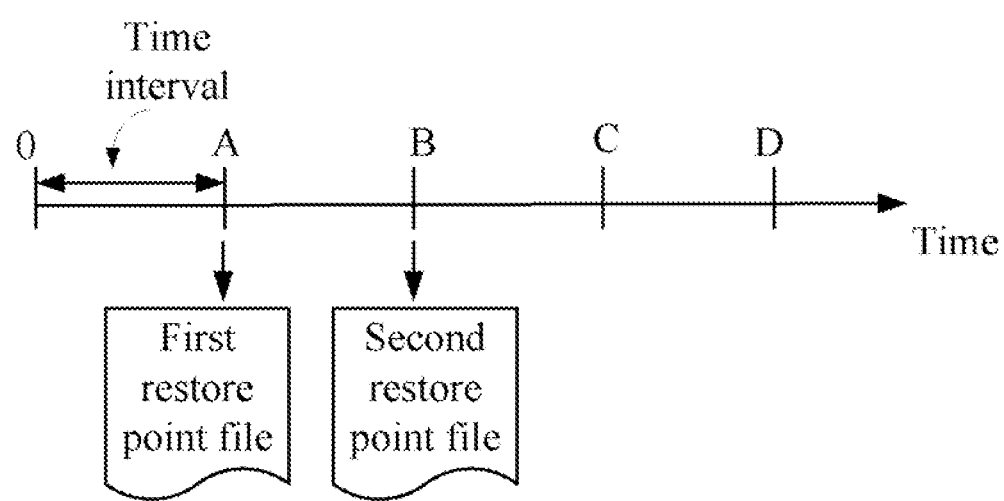
FIG. 4 is a schematic diagram illustrating restore points.

The storing module 22 obtains signal test data of each restore point from the test unit 12 and stores the obtained test data in a restore point file of the corresponding restore point. For example, if the receiving module 20 sets the time interval as 1 minute, the creation module 21 creates a new restore point file in the storage path every 1 minute, and the storing module 22 obtains signal test data when the restore point file is created and stores the signal test data to the corresponding restore point file. As shown in FIG. 4, time "A", "B", "C", and "D" are restore points. The first restore point file is created when the system time of the signal test apparatus 1 equals the time "A". The test storing module 22 obtains signal test data of the restore point "A" and stores the signal test data to the first restore point file.

The detection module 23 detects if the signal test apparatus 1 needs to be restored to a previous state. In one embodiment, if the signal test apparatus 1 is mistakenly operated by a user from a specific time, the signal test apparatus 1 needs to be restored to a previous state before the specific time. If the signal test apparatus 1 needs to be restored, the read module 24 reads signal test data stored in a latest created restore point file, and displays the signal test data on the display 11. As a result, the user may analyze the read signal test data, to check the condition of the signal test apparatus 1 before the test apparatus 1 is mistakenly operated.

Figure 3:
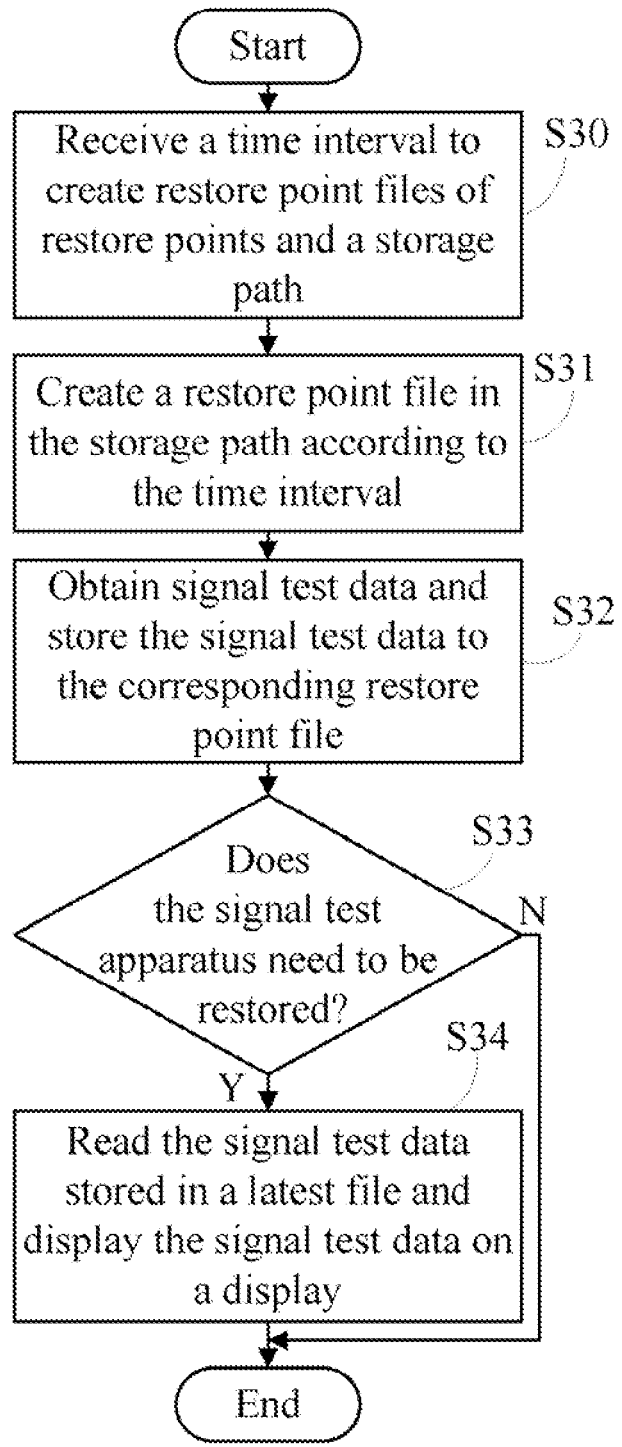
FIG. 3 is a flowchart of one embodiment of a signal test method.

FIG. 3 is a flowchart of one embodiment of a method for restoring signal test apparatus 1. Depending on the embodiment, additional blocks may be added, others removed, and the ordering of the blocks may be changed.

In block S30, the receiving module 20 receives a time interval to create restore point files of restore points of the signal test apparatus 1 input by a user, and receives a storage path for storing the restore point files set by the user. The time when each restore point file is created is defined as a restore point.

In block S31, the test unit 12 tests the test object 2, the creation module 21 creates a restore point file according to the time interval in the storage path.

In block S32, the storing module 32 obtains signal test data of each restore point from the test unit 12, and stores the obtained test data in a restore point file of each corresponding restore point.

In block S33, the detection module 23 detects if the signal test apparatus 1 needs to be restored to a previous state. If the signal test apparatus 1 needs to restored to a previous state, block S34 is implemented. Otherwise, the procedure ends.

In block S34, the read module 24 reads signal test data stored in the latest restore point file, and displays the signal test data on the display 11. As a result, the signal test apparatus 1 can be restored to a previous state according to the read signal test data.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A signal test apparatus, comprising:
    a storage system;
    at least one processor; and
    a restore system being stored in the storage system and executable by the at least one processor, the restore system comprising:
    a receiving module operable to receive a time interval to create restore point files set by a user;
    a creation module operable to create a restore point file of a corresponding restore point according to the time interval;
    a storing module operable to obtain signal test data of the corresponding restore point, and store the signal test data in the restore point file corresponding to the restore point; and
    a read module operable to read signal test data stored in a latest restore point file, and display the read signal test data on a display of the signal test apparatus, so that the signal test apparatus is restored to a previous state according to the read signal test data.

2. The signal test apparatus as claimed in claim 1, wherein the signal test data comprises: a current system time of the signal test apparatus, test channels of the signal test apparatus, and waveform charts of the signal test data corresponding to the current system time.

3. The signal test apparatus as claimed in claim 1, wherein the receiving module is further operable to receive a storage path for storing the restore point files.

4. A method for restoring a signal test apparatus, comprising:
    receiving a time interval to create restore point files set by a user;
    creating a restore point file of a corresponding restore point according to the time interval;
    obtaining signal test data of the corresponding restore point, and storing the signal test data in the restore point file corresponding to the restore point; and
    reading signal test data stored in a latest restore point file, and displaying the read signal test data on a display of the signal test apparatus, so that the signal test apparatus is restored to a previous state according to the read signal test data.

5. The method as claimed in claim 4, wherein the signal test data comprises: a current system time of the signal test apparatus, test channels of the signal test apparatus, and waveform charts of the signal test data corresponding to the current system time.

6. The method as claimed in claim 4, further comprising: receiving module is further operable to receive a storage path for storing the restore point files.

7. A non-transitory machine-readable storage medium storing a set of instructions, the set of instructions capable of being executed by a processor to perform a method for restoring a signal test apparatus, the method comprising:
    receiving a time interval to create restore point files set by a user;
    creating a restore point file of a corresponding restore point according to the time interval;
    obtaining signal test data of the corresponding restore point, and storing the signal test data in the restore point file corresponding to the restore point; and
    reading signal test data stored in a latest restore point file, and displaying the read signal test data on a display of the signal test apparatus, so that the signal test apparatus is restored to a previous state according to the read signal test data.

8. The non-transitory machine-readable storage medium as claimed in claim 7, wherein the signal test data comprises: a current system time of the signal test apparatus, test channels of the signal test apparatus, and waveform charts of the signal test data corresponding to the current system time.

9. The non-transitory machine-readable storage medium as claimed in claim 7, further comprising: receiving module is further operable to receive a storage path for storing the restore point files.

* * * * *